(12) United States Patent
Pan et al.

(10) Patent No.: US 6,654,210 B2
(45) Date of Patent: Nov. 25, 2003

(54) SOLID-STATE INDUCTOR AND METHOD FOR SAME

(75) Inventors: Wei Pan, Vancouver, WA (US); Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 52 days.

(21) Appl. No.: 10/131,411

(22) Filed: Apr. 22, 2002

(65) Prior Publication Data

US 2003/0197587 A1 Oct. 23, 2003

(51) Int. Cl.[7] .............................................. G11B 5/127
(52) U.S. Cl. ..................................... 360/324; 360/324.2
(58) Field of Search ................................. 336/200, 223, 336/232; 438/692; 360/324, 324.2, 324.12; 365/158, 173, 160–161, 157, 171

(56) References Cited

U.S. PATENT DOCUMENTS 6,204,139 B1 * 3/2001 Liu et al. ..................... 438/385
6,225,801 B1 * 5/2001 Jin et al. ..................... 324/252
6,316,131 B1 * 11/2001 Saboungi et al. ........... 428/692
6,495,828 B1 * 12/2002 Tidrow et al. ........... 250/338.2

* cited by examiner

Primary Examiner—Anh Mai
(74) Attorney, Agent, or Firm—David C. Ripma; Matthew D. Rabdau; Scott C. Krieger

(57) ABSTRACT

A solid-state inductor and a method for forming a solid-state inductor are provided. The method comprises: forming a bottom electrode; forming a colossal magnetoresistance (CMR) thin film overlying the bottom electrode; forming a top electrode overlying the CMR thin film; applying an electrical field treatment to the CMR thin film in the range of 0.4 to 1 megavolts per centimeter (MV/cm) with a pulse width in the range of 100 nanoseconds (ns) to 1 millisecond (ms); in response to the electrical field treatment, converting the CMR thin film into a CMR thin film inductor; applying a bias voltage between the top and bottom electrodes; and, in response to the applied bias voltage, creating an inductance between the top and bottom electrodes. When the applied bias voltage is varied, the inductance varies in response.

21 Claims, 3 Drawing Sheets

SOLID-STATE INDUCTOR AND METHOD FOR SAME

BACKGROUND OF THE INVENTION

1. Field of the Invention

This invention generally relates to semiconductor fabrication and, more particularly, to a solid-state inductor for analog integrated circuit (IC) fabrication and a method for processing the same.

2. Description of the Related Art

Conventionally, an IC integrated inductor is formed from a metal line, designed in spiral form, overlying a thick layer of insulator on silicon substrate. The inductance value of an inductor so formed is very low, so that the formation of a practical inductor requires a large silicon area. Besides using a great amount of valuable IC area, the large-sized inductors generate parasitic reactances and unintended mutual inductances with components that are adjacent, overlying, or underlying the inductor.

Further, a conventional inductor is a passive component, meaning that once it is formed in the IC, the inductance value cannot be changed. Thus, the inductor cannot be used for frequency tuning. Frequency tuning would be desirable in the fabrication of circuits such as filters, antennas, and oscillators, to name a few of examples.

It would be advantageous if an IC inductor could be made smaller, with a greater inductance value.

It would be advantageous if the inductance value of an IC inductor could be varied or tuned in an IC circuit.

SUMMARY OF THE INVENTION

The present invention describes a solid-state inductor, which has a relatively high inductance value, requires a very small area, and is suitable to be integrated into the conventional integrated circuits, whether it is a CMOS or a Bipolar circuit fabricated on silicon, or on compound semiconductor substrate.

Accordingly, a method is provided for forming a solid-state inductor. The method comprises: forming a bottom electrode; forming a colossal magnetoresistance (CMR) thin film overlying the bottom electrode; forming a top electrode overlying the CMR thin film; applying an electrical field treatment to the CMR thin film in the range of 0.4 to 1 megavolts per centimeter (MV/cm) with a pulse width in the range of 100 nanoseconds to 1 millisecond; in response to the electrical field treatment, converting the CMR thin film into a CMR thin film inductor; applying a bias voltage between the top and bottom electrodes; and, in response to the applied bias voltage, creating an inductance between the top and bottom electrodes. When the applied bias voltage is varied, the inductance varies in response.

The CMR thin film overlying the bottom electrode includes using a material such as $Pr_{0.3}Ca_{0.7}MnO_3$ (PCMO), $La_{0.7}Ca_{0.3}MnO_3$ (LCMO), $Y_{1-x}Ca_xMnO_3$ (YCMO), or high-temperature super conductor (HTSC) materials with a film thickness of approximately 2000 Å. Forming the CMR thin film overlying the bottom electrode includes: spin-coating a first layer having a thickness of approximately 670 Å; annealing the first layer at a temperature of approximately 650 degrees C. for a period of approximately 30 minutes; spin-coating a second layer, having a thickness of approximately 670 Å, overlying the first layer; annealing the second layer at a temperature of approximately 550 degrees C for a period of approximately 30 minutes; spin-coating a third layer, having a thickness of approximately 670 Å, overlying the second layer; and, annealing the third layer at a temperature of approximately 550 degrees C for a period of approximately 30 minutes.

Additional details of the above-described method, and a solid-state inductor device are presented below.

DETAILED DESCRIPTION OF THE PREFERRED EMBODIMENTS

Figure 1:
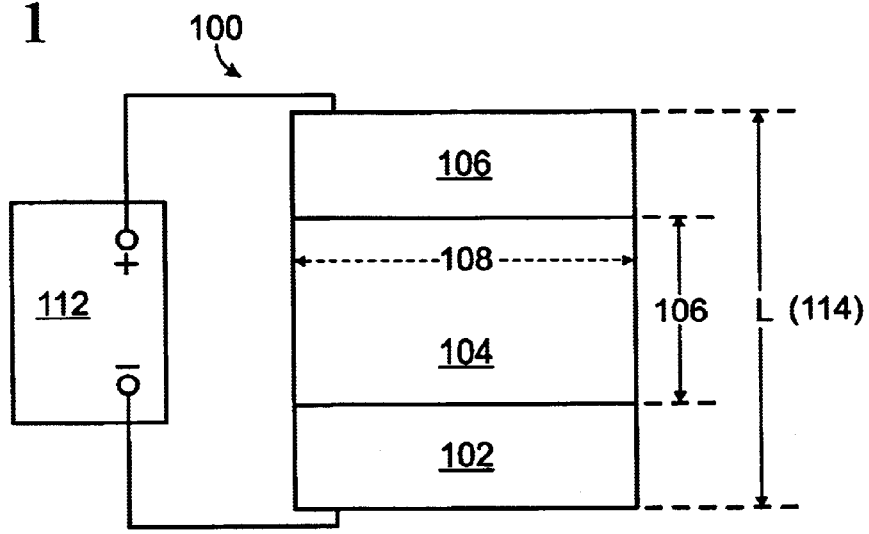
FIG. 1 is a diagram of the present invention solid-state inductor.

FIG. 1 is a diagram of the present invention solid-state inductor. The inductor 100 comprises a bottom electrode 102 and an electric field-treated colossal magnetoresistance (CMR) thin film 104 overlying the bottom electrode 102. A top electrode 106 overlies the CMR thin film 104.

The CMR thin film 104 is made from a material such as $Pr_{0.3}Ca_{0.7}MnO_3$ (PCMO), $La_{0.7}Ca_{0.3}MnO_3$ (LCMO), $Y_{1-x}Ca_xMnO_3$ (YCMO), or high-temperature super conductor (HTSC) materials. However, other equivalent materials might also be practical, depending upon requirements. The CMR thin film 104 has a thickness 108 of approximately 2000 Å.

As explained in more detail below, the CMR thin film 104 has been previously exposed to an electric field in the range of 0.4 to 1 megavolts per centimeter (MV/cm), with a pulse width in the range of 100 nanoseconds (ns) to 1 millisecond (ms). This is just an exemplary treatment. Other means of treatment are practical and depend upon the CMR material, intervening materials, and the desired inductance.

The bottom electrode 102 is made from a material such as Al, Au, Ti, Ta, Pt, Al, Cu, W, Ir, AlSi, or other noble metals. However, other conductors, well known in the fabrication of ICs could also be used. Likewise, the top electrode 106 is typically made from a material selected from the group including Al, Au, Ti, Ta, Pt, Al, Cu, W, Ir, AlSi, or other noble metals.

A means for applying a bias voltage between the top and bottom electrodes is shown, represented by reference designator 112. Typically, the solid-state inductor 100 is part of a larger, more complex circuit, and the bias voltage and relative ground are connections through other components, such as transistors, not shown. An inductance, or inductance value (L), represented by reference designator 114, is created between the top and bottom electrodes 106/102 in response to the applied bias voltage.

In some aspects, the voltage applying means 112 varies the applied bias voltage. The inductance 110 between the top and bottom electrodes 106/102 varies in response to variances in the applied bias voltage. Some practical bias voltage ranges have been developed as examples. In some aspects, the bias applying means 112 applies a voltage between the top and bottom electrodes 106/102 within the range of either 0.5 to 5 dc volts, or −0.5 to −5 dc volts.

However, for specific circuit applications an ac voltage can also be used. Further, other dc voltage ranges can be used for different variations of CMR material, CMR volume, and the electric field treatments.

Using the above-mentioned bias voltage values, the inductance 114 between the top and bottom electrodes 106/102 can be in the range of less than 0.01 micro-Henrys ($\mu$H) to greater than 1 $\mu$H, depending on bias voltage, the CMR material, and the geometries (volume, diameter, and thickness) of the CMR thin film 104. Typically, the inductance 114 between the top and bottom electrodes 106/102 is a maximum value in response to an applied voltage of either +1 dc volt or −1 dc volt. Again however, the relationship between maximum inductance and bias voltage is dependent upon CMR material and CMR geometries.

Functional Description

Figure 2:
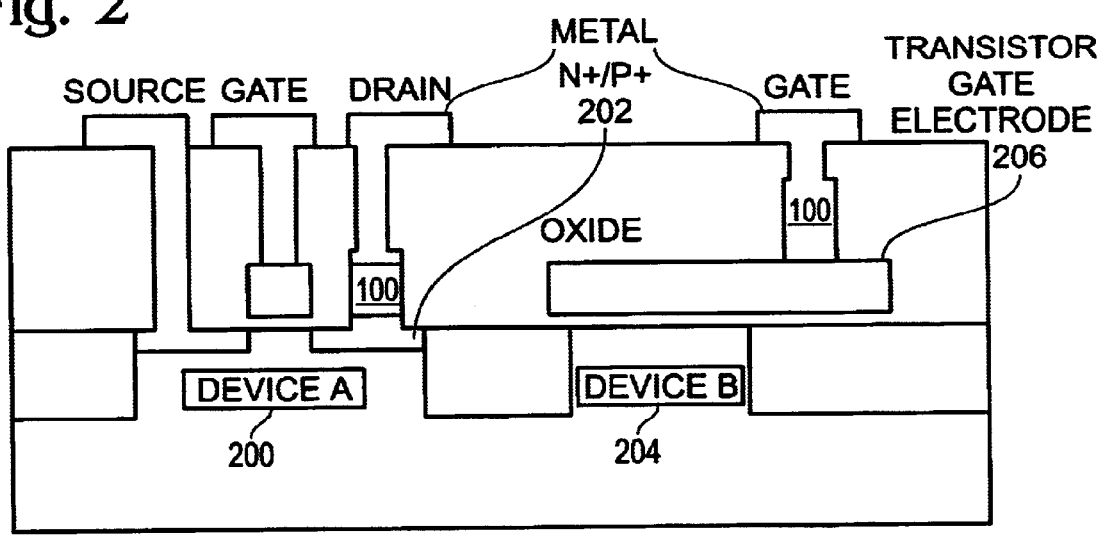
FIG. 2 illustrates the present invention solid-state inductor in a couple of practical IC applications.

FIG. 2 illustrates the present invention solid-state inductor 100 in a couple of practical IC applications. The present invention solid-state inductor is a two terminal pillar structure. It can be fabricated into a single via hole with bottom electrode onto a pn junction, or on a local interconnect metal line. The inductor can be integrated to the IC after the completion of the front end of processing as is illustrated in FIG. 2. In device A 200, the inductor 100 is integrated to a drain junction 202. In device B 204, the inductor 100 is integrated to a gate electrode 206. The inductor(s) 100 can be deposited onto the semiconductor substrate using conventional deposition methods, such as spin coating, sputtering and CVD process. The solid-state inductor has very high inductance that, using a bias voltage control, can vary more than two orders of magnitudes. The tuning of any LC circuit, of which the inductor 100 is a part, can be achieved by adjusting the bias voltage across the inductor 100.

For example, a present invention inductor can be made using a colossal magnetoresistance (CMR) thin film resistor, fabricated using a spin-coating process. The CMR material can be PCMO ($Pr_{0.3}Ca_{0.7}MnO_3$). The film is coated three times for a total thickness of about 200 nm onto Platinum substrate. The film is annealed at 650° C. for 30 minutes after a first coating, and annealed at 550° C. for 30 minutes after the second and the third coatings. The top electrode is also Platinum, although some other metals such as Al, Cu, W, Ir, AlSi, or other noble metals may also be used. The impedance of the as-fabricated film is a measured having resistance and capacitance components.

Figure 3:
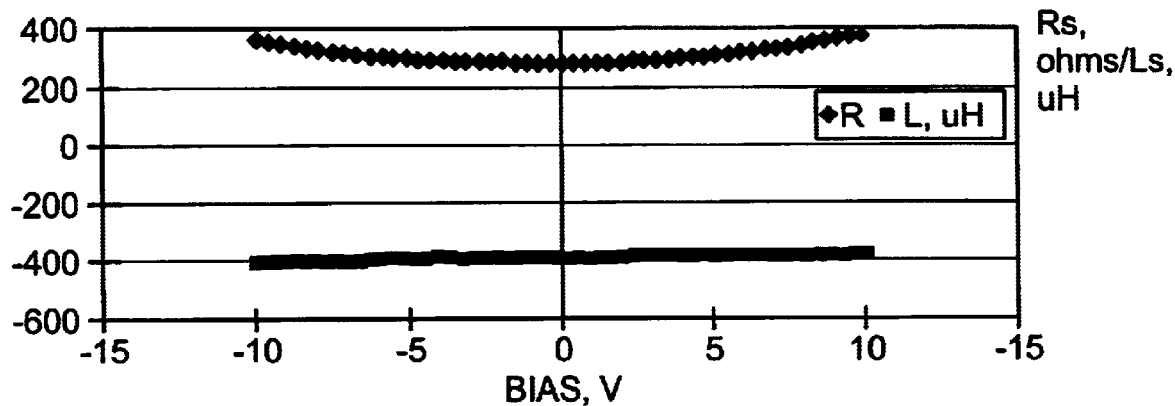
FIG. 3 illustrates the reactance of an exemplary CMR film, before electric field treatment.

FIG. 3 illustrates the reactance of an exemplary CMR film, before electric field treatment. All measurements are of resistance in series with inductance. The measurement frequency is 1 MHz. The measured inductance shown is negative and, therefore, capacitive. The figure also shows that the capacitance and the resistance of this thin film is practically independent of voltage in the given measurement region.

Figure 4:
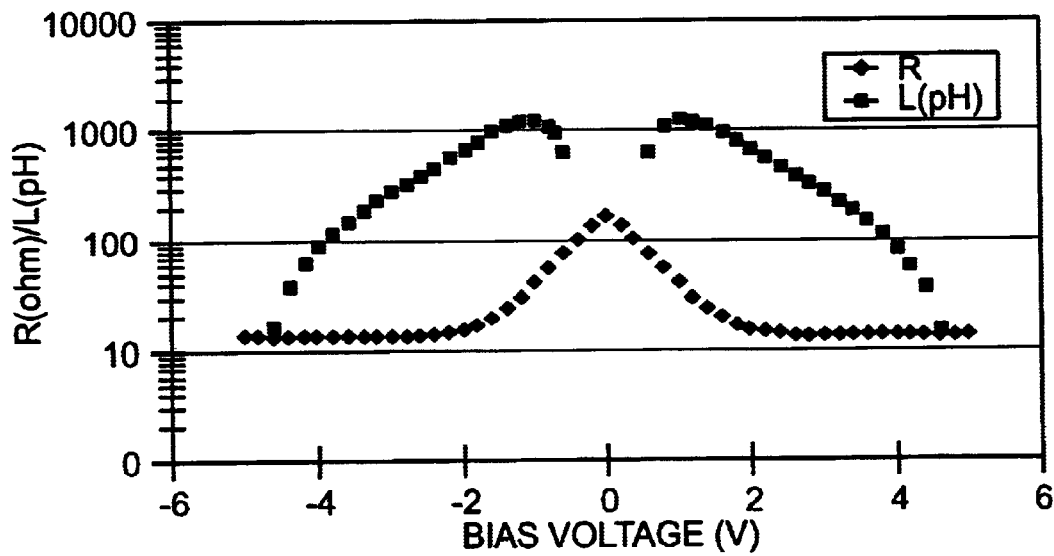
FIG. 4 illustrates the reactance of the exemplary CMR film after electric field treatment.

FIG. 4 illustrates the reactance of the exemplary CMR film after electric field treatment. The property of the impedance changes drastically after an electric field of 0.4 MV/cm to 1 MV/cm is applied to the CMR film. The resistance of the CMR film decreases from about 275 Ohms to lower than 20 Ohm. The CMR film becomes inductive in response to bias voltages of −5V to −0.5V, or 0.5V to 5V. Outside of these bias voltage ranges, the reactance of the CMR film is capacitance. The maximum inductance is more than 1 $\mu$H.

The inductance of the PCMO solid-state inductor can be varied by more than two orders of magnitude by changing the voltage applied to the device. From the nature of the material, it is expected that colossal magnetoresistance (CMR) and high temperature super conductor (HTSC) material are practical for electrically tunable solid-state inductor fabrication. The device area determines the magnitude of the inductance. The solid-state electrically tunable inductor is suitable as a build-in element for filters and antennas of any integrated circuit.

Figure 5:
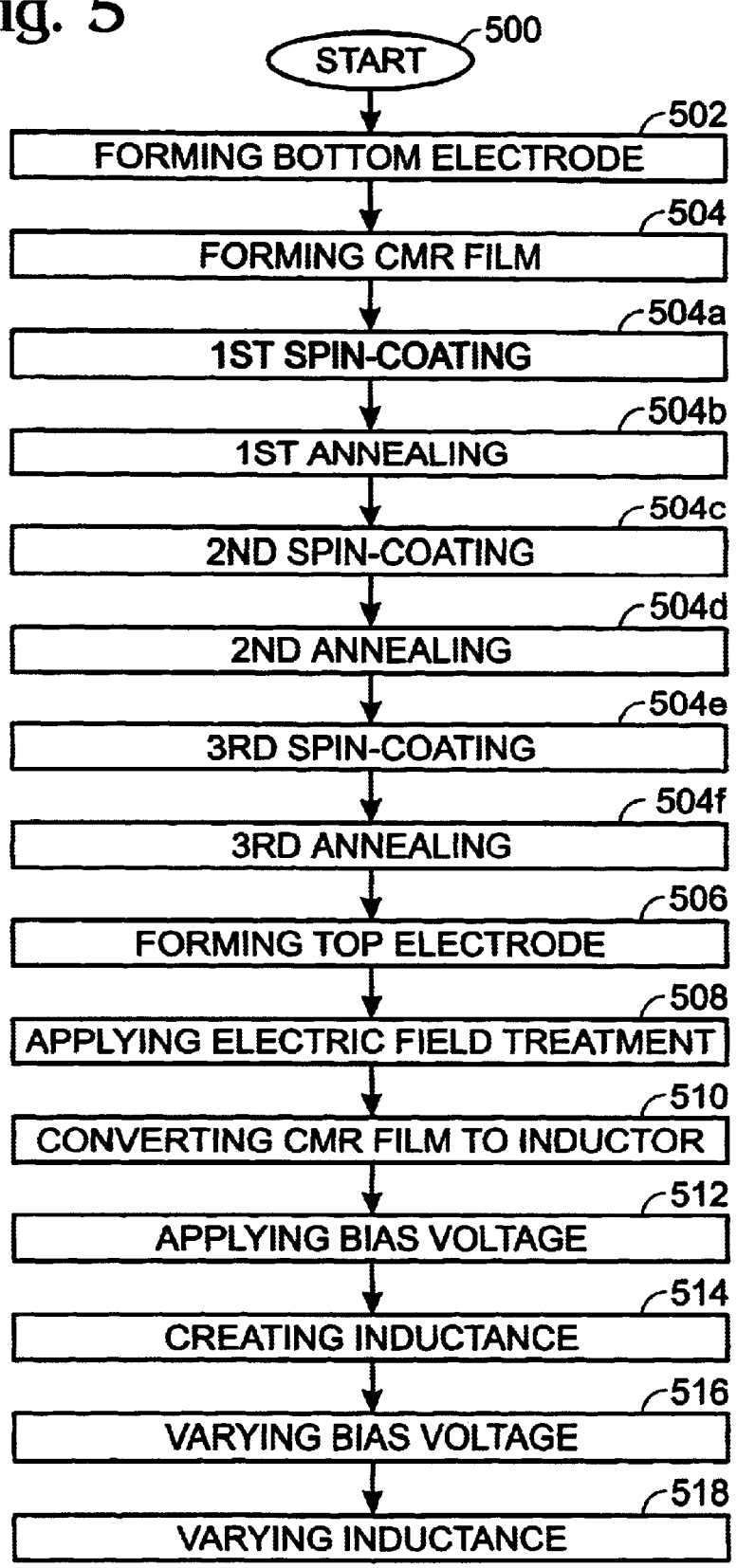
FIG. 5 is a flowchart illustrating the present invention method for forming a solid-state inductor.

FIG. 5 is a flowchart illustrating the present invention method for forming a solid-state inductor. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 500. Step 502 forms a bottom electrode. Step 504 forms a colossal magnetoresistance (CMR) thin film overlying the bottom electrode. Step 506 forms a top electrode overlying the CMR thin film. Step 508 applies an electrical field treatment to the CMR thin film. Alternately, Step 508 applies an electric field while simultaneously annealing the CMR thin film. Step 510, in response to the electrical field treatment, converts the CMR thin film into a CMR thin film inductor.

Some aspects of the method include further steps. Step 512 applies a bias voltage between the top and bottom electrodes. Step 514, in response to the applied bias voltage, creates an inductance between the top and bottom electrodes. In other aspects, Step 516 varies the applied bias voltage. Step 518 varies the inductance in response to variances in the applied bias voltage.

Forming a CMR thin film overlying the bottom electrode in Step 504 includes using a material such as $Pr_{0.3}Ca_{0.7}MnO_3$ (PCMO), $La_{0.7}Ca_{0.3}MnO_3$ (LCMO), $Y_{1-x}Ca_xMnO_3$ (YCMO), or high-temperature super conductor (HTSC) materials. In some aspects, the CMR thin film is formed to thickness of approximately 2000 Å, depending upon the variables mentioned above.

In some aspects, forming a CMR thin film overlying the bottom electrode in Step 504 includes substeps. Step 504a spin-coats a first layer having a thickness of approximately 670 Å. Step 504b anneals the first layer at a temperature of approximately 650 degrees C. for a period of approximately 30 minutes. Step 504c spin-coats a second layer, having a thickness of approximately 670 Å, overlying the first layer. Step 504d anneals the second layer at a temperature of approximately 550 degrees C for a period of approximately 30 minutes. Step 504e spin-coats a third layer, having a thickness of approximately 670 Å, overlying the second layer. Step 504f anneals the third layer at a temperature of approximately 550 degrees C for a period of approximately 30 minutes.

In some aspects of the method, forming a bottom electrode in Step 502 includes forming a bottom electrode from a material such as Al, Au, Ti, Ta, Pt, Al, Cu, W, Ir, AlSi, or other noble metals. Likewise, forming a top electrode in Step 506 includes forming a top electrode from a material such as Al, Au, Ti, Ta, Pt, Al, Cu, W, Ir, AlSi, or other noble metals.

In some aspects, applying an electrical field treatment to the CMR thin film in Step 508 includes applying an electric field in the range of 0.4 to 1 megavolts per centimeter (MV/cm) with a pulse width in the range of 100 ns to 1 ms.

In some aspects, applying a bias voltage between the top and bottom electrodes in Step 512 includes applying a bias voltage between the top and bottom electrodes of either a dc voltage within the range of 0.5 to 5 volts, or a dc voltage within the range of −0.5 to −5 volts. Creating an inductance between the top and bottom electrodes in Step 514 includes creating an inductance in the range of less than 0.01 micro-Henry ($\mu$H) to greater than 1 $\mu$H.

In some aspects, varying the inductance between the top and bottom electrodes in response to variances in the applied bias voltage in Step 518 includes creating the maximum inductance at a bias voltage of either approximately +1 dc volt, or approximately −1 dc volt.

A solid-state inductor and solid-state inductor fabrication method have been provided. A few practical inductor applications have been provided as examples. However, the present invention solid-state inductor has wider application than merely these examples. Likewise, a exemplary fabrication process has been given, but the solid-state inductor could be fabricated using equivalent processes and materials. Other variations and embodiments of the invention will occur to those skilled in the art.

We claim:

1. A solid-state inductor, the inductor comprising:
    a bottom electrode;
    an electric field-treated colossal magnetoresistance (CMR) thin film overlying the bottom electrode; and,
    a top electrode overlying the CMR thin film.

2. The inductor of claim 1 further comprising:
    a means for applying a bias voltage between the top and bottom electrodes; and,
    wherein an inductance is created between the top and bottom electrodes in response to the applied bias voltage.

3. The inductor of claim 2 further comprising:
    wherein the voltage applying means varies the applied bias voltage; and,
    wherein the inductance between the top and bottom electrodes varies in response to variances in the applied bias voltage.

4. The inductor of claim 3 wherein the magnetoresistance (CMR) thin film includes a $Pr_{0.3}Ca_{0.7}MnO_3$ (PCMO), $La_{0.7}Ca_{0.3}MnO_3$ (LCMO), $Y_{1-x}Ca_xMnO_3$ (YCMO), and high-temperature super conductor (HTSC) materials.

5. The inductor of claim 3 wherein the magnetoresistance (CMR) thin film has a thickness of approximately 2000 Å.

6. The inductor of claim 3 wherein the bias applying means applies a voltage between the top and bottom electrodes selected from the group including:
    a dc voltage within the range of 0.5 to 5 volts; and,
    a dc voltage within the range of −0.5 to −5 volts.

7. The inductor of claim 6 wherein the inductance between the top and bottom electrodes is a maximum value in response to an applied voltage selected from the group including approximately +1 dc volt and −1 dc volt.

8. The inductor of claim 3 wherein the inductance between the top and bottom electrodes has a value in the range of less than 0.01 micro-Henrys ($\mu H$) to greater than 1 $\mu H$.

9. The inductor of claim 2 wherein the bottom electrode includes a material selected from the group including Al, Au, Ti, Ta, Pt, Al, Cu, W, Ir, AlSi, and other noble metals.

10. The inductor of claim 2 wherein the top electrode includes a material selected from the group including Al, Au, Ti, Ta, Pt, Al, Cu, W, Ir, AlSi, and other noble metals.

11. The inductor of claim 2 wherein the electric field-treated CMR thin film has been exposed to an electric field in the range of 0.4 to 1 MV/cm, with a pulse width in the range of 100 nanoseconds (ns) to 1 millisecond (ms).

12. A solid-state inductor, the inductor comprising:
    a bottom electrode;
    an electric field-treated colossal magnetoresistance (CMR) thin film overlying the bottom electrode;
    a top electrode overlying the CMR thin film;
    a means for applying a bias voltage between the top and bottom electrodes; and,
    wherein the electric field-treated CMR thin film has been exposed to an electric field in the range of 0.4 to 1 MV/cm, with a pulse width in the range of 100 nanoseconds (ns) to 1 millisecond (ms).

13. A solid-state inductor, the inductor comprising:
    a bottom electrode;
    an electric field-treated colossal magnetoresistance (CMR) thin film overlying the bottom electrode;
    a top electrode overlying the CMR thin film;
    a means for applying a varied bias voltage between the top and bottom electrodes selected from the group including:
        a dc voltage within the range of 0.5 to 5 volts; and,
        a dc voltage within the range of −0.5 to −5 volts; and,
        wherein the inductance between the top and bottom electrodes varies in response to variances in the applied bias voltage.

14. A solid-state inductor, the inductor comprising:
    a bottom electrode;
    an electric field-treated colossal magnetoresistance (CMR) thin film overlying the bottom electrode;
    a top electrode overlying the CMR thin film;
    a means for applying a varied bias voltage between the top and bottom electrodes; and,
    wherein the inductance between the top and bottom electrodes varies in response to variances in the applied bias voltage in the range of less than 0.01 micro-Henrys ($\mu H$) to greater than 1 $\mu H$.

15. The inductor of claim 13 wherein the inductance between the top and bottom electrodes is a maximum value in response to an applied voltage selected from the group including approximately +1 dc volt and −1 dc volt.

16. A solid-state inductor, the inductor comprising:
    a bottom electrode;
    an electric field-treated colossal magnetoresistance (CMR) thin film overlying the bottom electrode, wherein the CMR thin film has been treated with an electric field in the range of 0.4 to 1 megavolts per centimeter (MV/cm) and a pulse width in the range of 100 nanoseconds (ns) to 1 millisecond (ms); and,
    a top electrode overlying the CMR thin film.

17. The inductor of claim 16 wherein the CMR thin film is annealed simultaneously with the applied electric field treatment.

18. The inductor of claim 16 wherein the CMR thin film is treated with one pulse of an applied electric field.

19. A solid-state inductor, the inductor comprising:
    a bottom electrode;
    a single-pulse electric field-treated colossal magnetoresistance (CMR) thin film overlying the bottom electrode; and,
    a top electrode overlying the CMR thin film.

20. A solid-state inductor, the inductor comprising:
    a bottom electrode;
    an electric field-treated colossal magnetoresistance (CMR) thin film overlying the bottom electrode, wherein the CMR thin film has been treated with an electric field in the range of 0.4 to 1 megavolts per centimeter (MV/cm) and a single pulse width in the range of 100 nanoseconds (ns) to 1 millisecond (ms); and,
    a top electrode overlying the CMR thin film.

21. A solid-state inductor, the inductor comprising:
    a bottom electrode;
    an inductive colossal magnetoresistance (CMR) thin film overlying the bottom electrode; and,
    a top electrode overlying the CMR thin film.

* * * * *